(12) United States Patent
Shiokawa et al.

(10) Patent No.: US 12,433,173 B2
(45) Date of Patent: Sep. 30, 2025

(54) MAGNETIC FILM, MAGNETORESISTIVE EFFECT ELEMENT, AND METHOD FOR MANUFACTURING MAGNETIC FILM

(71) Applicant: TDK CORPORATION, Tokyo (JP)

(72) Inventors: Yohei Shiokawa, Tokyo (JP); Tomoyuki Sasaki, Tokyo (JP); Takeshi Seki, Sendai (JP); Koki Takanashi, Sendai (JP)

(73) Assignee: TDK CORPORATION, Tokyo (JP)

( * ) Notice: Subject to any disclaimer, the term of this patent is extended or adjusted under 35 U.S.C. 154(b) by 543 days.

(21) Appl. No.: 17/801,865

(22) PCT Filed: May 29, 2020

(86) PCT No.: PCT/JP2020/021381
§ 371 (c)(1),
(2) Date: Aug. 24, 2022

(87) PCT Pub. No.: WO2021/240796
PCT Pub. Date: Dec. 2, 2021

(65) Prior Publication Data
US 2023/0077612 A1   Mar. 16, 2023

(51) Int. Cl.
| | |
|---|---|
| *H10N 52/80* | (2023.01) |
| *H01F 10/16* | (2006.01) |
| *H01F 10/32* | (2006.01) |
| *H01F 41/14* | (2006.01) |
| *H10B 61/00* | (2023.01) |
| *H10D 48/40* | (2025.01) |
| *H10N 50/10* | (2023.01) |

(Continued)

(52) U.S. Cl.
CPC .............. *H10N 52/80* (2023.02); *H01F 10/16* (2013.01); *H01F 10/32* (2013.01); *H01F 41/14* (2013.01); *H10B 61/22* (2023.02); *H10D 48/40* (2025.01); *H10N 50/10* (2023.02); *H10N 50/85* (2023.02); *H10N 52/00* (2023.02); *H10N 52/01* (2023.02)

(58) Field of Classification Search
CPC ........ H10N 50/85; H10N 52/85; H10N 50/10; H01F 10/32
See application file for complete search history.

(56) References Cited

U.S. PATENT DOCUMENTS

| | | |
|---|---|---|
| 8,350,347 B2 | 1/2013 | Gaudin et al. |
| 9,589,619 B2 | 3/2017 | Lee et al. |

(Continued)

FOREIGN PATENT DOCUMENTS

| | | | | |
|---|---|---|---|---|
| JP | 62179704 A | * | 8/1987 | ............. H01F 1/057 |
| JP | 2004-237429 A | | 8/2004 | |

(Continued)

OTHER PUBLICATIONS

JP62179704A-Machine English translation (Year: 2025).*

(Continued)

*Primary Examiner* — Jose R Diaz
(74) *Attorney, Agent, or Firm* — Oliff PLC

(57) ABSTRACT

A magnetic film includes a ferromagnetic layer. The ferromagnetic layer has a thickness or a width in a first direction which is longer than a thickness or a width in another direction, a crystalline structure is a tetragonal structure, and a main vector direction of a c axis of the tetragonal structure is the first direction.

18 Claims, 8 Drawing Sheets

(51) Int. Cl.
  *H10N 50/85*  (2023.01)
  *H10N 52/00*  (2023.01)
  *H10N 52/01*  (2023.01)

(56) References Cited

U.S. PATENT DOCUMENTS

| | | | |
|---|---|---|---|
| 9,620,188 | B2 | 4/2017 | Manipatruni et al. |
| 2006/0002026 | A1 | 1/2006 | Stipe et al. |
| 2006/0056223 | A1 | 3/2006 | Ditewig et al. |
| 2006/0114714 | A1 | 6/2006 | Kanegae |
| 2006/0188743 | A1 | 8/2006 | Seki et al. |
| 2009/0155628 | A1 | 6/2009 | Lee et al. |
| 2011/0129691 | A1 | 6/2011 | Ishiwata et al. |
| 2012/0020152 | A1 | 1/2012 | Gaudin et al. |
| 2013/0026585 | A1 | 1/2013 | Sung et al. |
| 2013/0040167 | A1 | 2/2013 | Alagarsamy et al. |
| 2014/0056060 | A1 | 2/2014 | Khvalkovskiy et al. |
| 2014/0170776 | A1 | 6/2014 | Satoh et al. |
| 2014/0210581 | A1* | 7/2014 | Lewis ................ C22C 19/03 148/101 |
| 2014/0269032 | A1 | 9/2014 | Ong et al. |
| 2014/0272180 | A1* | 9/2014 | Kontos ................ G11B 5/852 427/523 |
| 2015/0008547 | A1 | 1/2015 | Pi et al. |
| 2015/0041934 | A1 | 2/2015 | Khvalkovskiy et al. |
| 2015/0129995 | A1 | 5/2015 | Wang et al. |
| 2015/0200003 | A1 | 7/2015 | Buhrman et al. |
| 2015/0348606 | A1 | 12/2015 | Buhrman et al. |
| 2016/0020207 | A1 | 1/2016 | Tsuchiya et al. |
| 2016/0021468 | A1 | 1/2016 | Karunasiri et al. |
| 2016/0225982 | A1 | 8/2016 | Guo |
| 2016/0359105 | A1 | 12/2016 | Sandhu et al. |
| 2017/0076769 | A1 | 3/2017 | Shirotori et al. |
| 2017/0117323 | A1 | 4/2017 | Braganca et al. |
| 2017/0222135 | A1 | 8/2017 | Fukami et al. |
| 2017/0250024 | A1* | 8/2017 | Lewis ................ H01F 1/14733 |
| 2018/0158588 | A1 | 6/2018 | Manipatruni et al. |
| 2018/0358542 | A1 | 12/2018 | Mihajlovic et al. |
| 2019/0051820 | A1 | 2/2019 | Sugiyama et al. |
| 2019/0131517 | A1 | 5/2019 | Shiokawa et al. |
| 2019/0189516 | A1 | 6/2019 | Sasaki et al. |
| 2019/0206602 | A1 | 7/2019 | Sasaki et al. |
| 2019/0206603 | A1 | 7/2019 | Sasaki et al. |
| 2019/0348329 | A1 | 11/2019 | Shiokawa et al. |
| 2020/0212104 | A1 | 7/2020 | Sonobe |
| 2021/0303981 | A1 | 9/2021 | Sasaki et al. |
| 2021/0364580 | A1 | 11/2021 | Tsumita et al. |

FOREIGN PATENT DOCUMENTS

| | | |
|---|---|---|
| JP | 2004-311925 A | 11/2004 |
| JP | 2005-526351 A | 9/2005 |
| JP | 2006-019000 A | 1/2006 |
| JP | 2006-118040 A | 5/2006 |
| JP | 2009-146558 A | 7/2009 |
| JP | 2014-045196 A | 3/2014 |
| JP | 5441005 B2 | 3/2014 |
| JP | 2016-021530 A | 2/2016 |
| JP | 2017-059594 A | 3/2017 |
| JP | 2017-216286 A | 12/2017 |
| JP | 2019-033166 A | 2/2019 |
| JP | 2019-121782 A | 7/2019 |
| JP | 2019-121783 A | 7/2019 |
| JP | 6620915 B1 | 12/2019 |
| JP | 2020-053509 A | 4/2020 |
| JP | 2020-107790 A | 7/2020 |
| WO | 2011/087007 A1 | 7/2011 |
| WO | 2014/204492 A1 | 12/2014 |
| WO | 2015/102739 A2 | 7/2015 |
| WO | 2016/021468 A1 | 2/2016 |
| WO | 2017/052494 A1 | 3/2017 |
| WO | 2018/189964 A1 | 10/2018 |
| WO | 2019/171715 A1 | 9/2019 |

OTHER PUBLICATIONS

JP2004237429-Machine English translation (Year: 2025).*
Aug. 4, 2020 International Search Report issued in International Patent Application No. PCT/JP2020/021381.
Y.K. Kato et al. "Observation of the Spin Hall Effect in Semiconductors". Science, 2004, vol. 306, pp. 1910-1913.
Ioan Mihai Miron et al. "Perpendicular Switching of a Single Ferromagnetic Layer Induced by In-Plane Current Injection". Nature, 2011, vol. 476, pp. 189-194.
Luqiao Liu et al. "Spin Torque Switching With the Giantspin Hall Effect of Tantalum". Science, 2012, vol. 336, 31 pages.
Luqiao Liu et al. "Current-Induced Switching of Perpendicularly Magnetized Magnetic Layers Using Spin Torque From the Spin Hall Effect". Physical Review Letters, 2012, vol. 109, pp. 096602-1-096602-5.
Ki-Seung Lee et al. "Threshold Current for Switching of a Perpendicular Magnetic Layer Induced by Spin Hall Effect". Applied Physics Letters, 2013, vol. 102, 17 pages.
Ki-Seung Lee et al. "Thermally Activated Switching of Perpendicular Magnet by Spin-Orbit Spin Torque". Applied Physics Letts, 2014, vol. 104, pp. 072413-1-072413-5.
Shunsuke Fukami et al. "Magnetization Switching By Spin-Orbit Torque in an Antiferromagnet-Ferromagnet Bilayer System". Nature Materials, 2016, vol. 15, pp. 535-542.
S. Fukami et al. "A Spin-Orbit Torque Switching Scheme With Collinear Magnetic Easy Axis and Current Configuration". Nature Nanotechnology, 2016.
S. Takahashi et al. "Spin Injection and Detection in Magnetic Nanostructures". Physical Review B, 2003, vol. 67, pp. 052409-1-052409-4.
Yeongkyo Seo et al. "Area-Efficient Sot-Mram With a Schottky Diode". IEEE Electron Device Letters, 2016, vol. 37, No. 8, pp. 982-985.
Wei Zhang et al. "Spin Hall Effects in Metallic Antiferromagnets". Physical Review Letters, 2014, vol. 113, pp. 196602-1-196602-6.
H. Sato et al. "Perpendicular-Anisotropy CoFeB—MgO Magnetic Tunnel Junctions With A MgO/CoFeB/Ta/CoFeB/MgO Recording Structure". Applied Physics Letters, 2012, vol. 101, pp. 022414-1-022414-4.
Luqiao Liu et al. "Magnetic Oscillations Driven By the Spin Hall Effect in 3-Terminal Magnetic Tunnel Junction Devices". Physical Review Letters, 2012, vol. 109, pp. 186602-1-186602-5.
Takashi Kimura et al. "Electrical Control of the Direction of Spin Accumulation". Physical Review Letters, 2007, vol. 99, pp. 166601-1-166601-4.
Guogiang Yu et al. "Switching of Perpendicular Magnetization by Spin-Orbit Torques in the Absence of External Magnetic Fields". Nature Nanotechnology, 2014, vol. 9, pp. 548-554.
Yeongkyo Seo et al. "High-Density SOT-MRAM Based on Shared Bitline Structure". IEEE Transactions on Very Large Scale Integration (VLSI) Systems, 2018, vol. 26, No. 8, pp. 1600-1603.

* cited by examiner

MAGNETIC FILM, MAGNETORESISTIVE EFFECT ELEMENT, AND METHOD FOR MANUFACTURING MAGNETIC FILM

TECHNICAL FIELD

The present invention relates to a magnetic film, a magnetoresistive effect element, and a method for manufacturing the magnetic film.

BACKGROUND ART

Next-generation nonvolatile memories replacing flash memories that have reached their limit in miniaturization have drawn an attention. For example, magnetoresistive random access memories (MRAMs), resistance random access memories (ReRAMs), phase change random access memories (PCRAMs), and the like are known as next-generation nonvolatile memories.

An MRAM is a memory element in which a magnetoresistive effect element is used. A resistance value of a magneto-resistance effect element changes in accordance with a difference in a relative angle of a magnetization direction between two magnetic films. An MRAM records a resistance value of a magnetoresistive effect element as data.

Data changes in accordance with a direction of magnetization of a magnetic film. When the direction of the magnetization is changed by an external force such as heat at a timing other than a time of writing of data, there is concern of data being rewritten unexpectedly. To keep a data retention time of an MRAM longer, an improvement in stability of magnetization is requested. In a magnetic film that has strong magnetic anisotropy, stability of magnetization is excellent.

For example, Patent Document 1 discloses that uniaxial magnetic anisotropy of a magnetic substance is improved by aligning a crystal grain orientation of a nanocrystalline soft magnetic material. For example, Patent Document 2 discloses that uniaxial magnetic anisotropy of a magnetic substance is improved by regularizing a FePt alloy.

CITATION LIST

Patent Literature

[Patent Document 1]
Japanese Unexamined Patent Application, First Publication No. 2006-118040
[Patent Document 1]
Japanese Unexamined Patent Application, First Publication No. 2004-311925

SUMMARY OF INVENTION

Technical Problem

Uniaxial magnetic anisotropy of a magnetic film is determined in accordance with various factors. For example, anisotropy generated in accordance with a shape of a magnetic film (shape magnetic anisotropy), anisotropy generated due to an influence of an interface between adjacent layers (interface magnetic anisotropy), and anisotropy generated in accordance with a crystalline structure of a magnetic film (crystalline magnetic anisotropy) are factors that have an influence on magnetic anisotropy of a magnetic film.

In a magnetic film of a magnetoresistive effect element, there are various restrictions on a shape, a relationship between adjacent layers, and the like. Therefore, it is difficult to freely design a direction of uniaxial magnetic anisotropy of the magnetic film.

The present invention has been devised in view of the foregoing problem and an objective of the present invention is to provide a method for manufacturing the magnetic film in which a direction of uniaxial magnetic anisotropy of a magnetic film can be freely designed.

An objective of the present invention is to provide a magnetic film that has strong magnetic anisotropy by aligning a direction of shape magnetic anisotropy and a direction of crystalline magnetic anisotropy and to provide a magnetoresistive effect element that has excellent data retention performance.

Solution to Problem (1) According to a first aspect, a magnetic film includes a ferromagnetic layer. The ferromagnetic layer has a thickness or a width in a first direction which is longer than a thickness or a width in another direction, a crystalline structure is a tetragonal structure, and a main vector direction of a c axis of the tetragonal structure is the first direction.

(2) In the magnetic film according to the aspect, the first direction may intersect a thickness direction of the ferromagnetic layer.

(3) In the magnetic film according to the aspect, the first direction may be a thickness direction of the ferromagnetic layer.

(4) In the magnetic film according to the aspect, the ferromagnetic layer may have an $L1_0$ structure or a $D0_{22}$ structure.

(5) In the magnetic film according to the aspect, the ferromagnetic layer may include one of the group consisting of a PtFe alloy, a PtCo alloy, a PdFe alloy, an FeNi alloy, a MnGa alloy, and a MnGe alloy.

(6) In the magnetic film according to the aspect, the ferromagnetic layer may include one selected from the group consisting of boron, carbon, and silver.

(7) The magnetic film according to the aspect may further include an impurity absorption layer. The impurity absorption layer may be stacked in a thickness direction of the ferromagnetic layer. The impurity absorption layer may include one element selected from the group consisting of Mg, Ta, W, and Mo.

(8) The magnetic film according to the aspect may further include a diffusion prevention layer. The diffusion prevention layer may be stacked opposite to the impurity absorption layer when the ferromagnetic layer serves as a reference layer. The diffusion prevention layer may include one element selected from the group consisting of Ta, Mo, W, Cr, and V.

(9) The magnetic film according to the aspect may further include an underlying layer. The underlying layer may be stacked in a thickness direction of the ferromagnetic layer. The underlying layer may be amorphous.

(10) The magnetic film according to the aspect may further include an underlying layer. The underlying layer may be stacked in a thickness direction of the ferromagnetic layer. The underlaying layer has a crystalline structure. Lattice mismatch between a crystal lattice of an alignment surface of the underlying layer and a crystal lattice of a (111) surface of the ferromagnetic layer may be equal to or greater than 5%.

(11) According to a second aspect, a magnetoresistive effect element includes the magnetic film according to the foregoing aspect, a second magnetic film, and a nonmagnetic film between the magnetic film and the second magnetic film.

(12) The magnetoresistive effect element according to the foregoing aspect may further include a spin orbital torque wiring configured to have a function of generating a spin current by a spin Hall effect when a current flows. The spin orbital torque wiring may be in contact with the magnetic film.

(13) The magnetoresistive effect element according to the foregoing aspect may further include a spin orbital torque wiring configured to have a function of generating a spin current by a spin Hall effect when a current flows. The spin orbital torque wiring may be in contact with the second magnetic film.

(14) According to a third aspect, a method for manufacturing the magnetic film includes crystalizing an alloy in which a disorder structure and an order structure can be selected while applying a direct-current magnetic field in one direction under a temperature condition equal to or greater than a Curie temperature $T_{CD}$ of the disorder structure and equal to or less than a Curie temperature $T_{CO}$ of the order structure.

(15) In the method for manufacturing the magnetic film according to the foregoing aspect, the crystallizing may be performed after a film of the alloy is formed.

(16) In the method for manufacturing the magnetic film according to the foregoing aspect, a direction in which the direct-current magnetic field is applied may be a thickness direction of a magnetic film to be stacked.

(17) In the method for manufacturing the magnetic film according to the foregoing aspect, a direction in which the direct-current magnetic field is applied may be an in-plane direction of a magnetic film to be stacked.

(18) In the method for manufacturing the magnetic film according to the foregoing aspect, the direct-current magnetic field may be equal to or less than 2 T.

(19) In the method for manufacturing the magnetic film according to the foregoing aspect, during an increase in temperature, the direct-current magnetic field may be applied from a temperature equal to or less than the Curie temperature $T_{CD}$ of the disorder structure.

(20) In the method for manufacturing the magnetic film according to the foregoing aspect, the temperature condition may be equal to or greater than 350° C.

Advantageous Effects of Invention

The magnetic film and the magnetoresistive effect element according to the aspects have excellent stability of magnetization. In the method for manufacturing the magnetic film according to the aspect, any alignment direction of magnetization of a magnetic film can be set.

DESCRIPTION OF EMBODIMENTS

Figure 1:
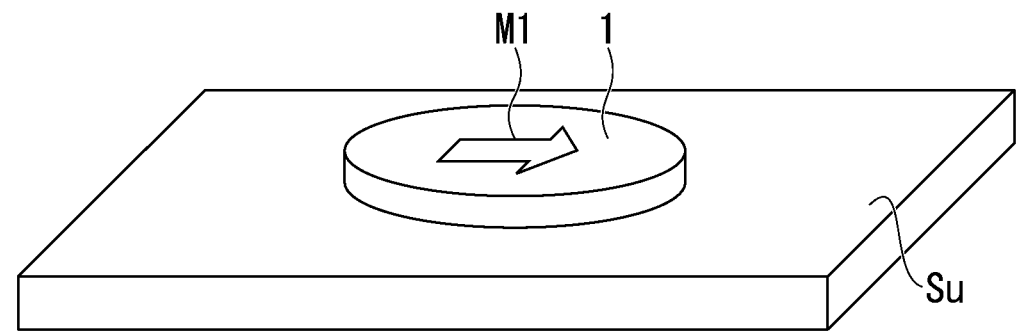
FIG. 1 is a perspective view illustrating a magnetic film according to a first embodiment.

Hereinafter, embodiments will be described in detail with appropriate reference to the drawings. In the drawings used for the following description, characteristic portions are enlarged to facilitate understanding of features of the present invention in some cases, and thus dimensional ratios of constituent elements are different from actual dimensional ratios. Materials, dimensions, and the like in the following description are exemplary examples, and the present invention is not limited thereto and can be appropriately modified in a scope in which the advantageous effects of the present invention are obtained.

First, directions will be defined. A thickness direction of a magnetic film is defined as the z direction. The z direction is also a stacking direction of a magnetic film. One direction orthogonal to the z direction is defined as the x direction and a direction orthogonal to the x direction is defined as the y direction.

First Embodiment (Magnetic Film)

FIG. 1 is a perspective view illustrating a magnetic film 1 according to a first embodiment. In FIG. 1, a support Su that supports the magnetic film 1 is also illustrated. The magnetic film 1 is stacked on the support Su. The magnetic film 1 is formed of a single ferromagnetic layer.

The magnetic film 1 has anisotropy in a shape when viewed in the z direction. The magnetic film 1 illustrated in FIG. 1 has an elliptical shape that has a major axis in the x direction in a plan view from the z direction. The shape of the magnetic film 1 in the z direction in a plan view is not limited to an elliptical shape and may be rectangular or irregular. The width of the magnetic film 1 in the x direction is longer than the width in the y direction and is longer than the thickness in the z direction. The x direction of the magnetic film 1 illustrated in FIG. 1 is an example of a first direction.

The magnetic film 1 exhibits shape magnetic anisotropy in the x direction. The shape magnetic anisotropy is easy alignment in a specific direction of magnetization caused from the shape of the magnetic film 1. The magnetic film 1 has anisotropy in the shape, and the magnitude of a diamagnetic field in the major axis direction differs from that in the minor axis direction. Magnetization M1 of the magnetic film 1 is easily aligned in the major axis direction of the magnetic film 1 in which a diamagnetic field is weak.

Figure 2:
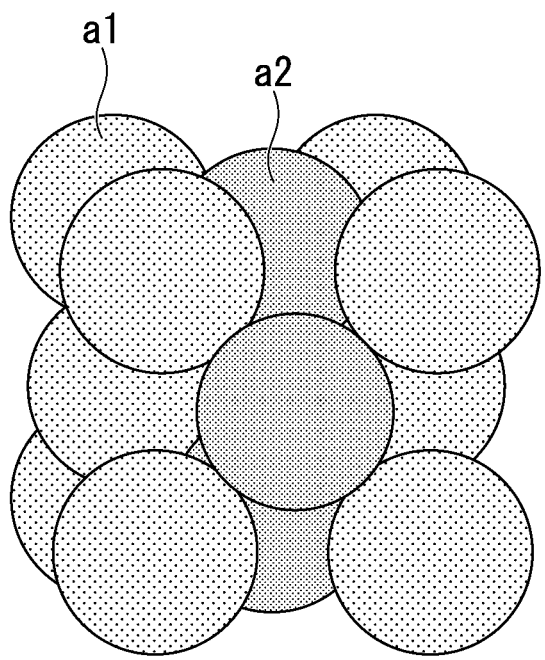
FIG. 2 is a schematic view illustrating a crystalline structure of the magnetic film according to the first embodiment.

FIG. 2 is a schematic view illustrating a crystalline structure of the magnetic film 1 according to the first embodiment. The magnetic film 1 is a magnetic substance with a tetragonal structure. A c axis of the magnetic film 1 is the x direction. Here, the c axis of the magnetic film 1 may not completely coincide with the x direction and a main vector direction of the c axis may coincide with the x direction. The fact that the main vector direction is oriented in the x direction means that a vector length in the x direction is the longest when an alignment direction of the c axis is projected in each of the x, y, and z directions.

The magnetic film 1 exhibits crystalline magnetic anisotropy in the x direction. The crystalline magnetic anisotropy is easy alignment of the magnetization M1 in a specific direction caused by a crystalline structure of the magnetic film 1. Crystalline magnetic anisotropy is caused due to a difference of an electronic structure of the crystal in a crystalline orientation. In the magnetic substance with a tetragonal structure, magnetization is easily aligned in the c axis direction and the magnetization M1 of the magnetic film 1 is easily aligned in the c axis direction.

The magnetization M1 of the magnetic film 1 is aligned in the x direction. In the magnetic film 1, a direction of the shape magnetic anisotropy coincides with a direction of the crystalline magnetic anisotropy. The magnetic film 1 exhibits strong magnetic anisotropy in the x direction since the direction of the shape magnetic anisotropy coincides with the direction of the crystalline magnetic anisotropy.

The magnetic film 1 includes, for example, an alloy with a tetragonal structure. The magnetic film 1 includes, for example, one of the group consisting of a PtFe alloy, a PtCo alloy, a PdFe alloy, an FeNi alloy, a MnGa alloy, or a MnGe alloy.

The magnetic film 1 includes, for example, a crystal with an order structure. The magnetic film 1 is formed of, for example, a crystal with an order structure. FIG. 2 illustrates a crystalline structure of the magnetic film 1 with the order structure. The order structure is a superlattice structure in which a first atom a1 and a second atom a2 are alternately arranged. The first atom a1 is, for example, Pt or Pd and the second atom a2 is, for example, Fe or Co. An $L1_0$ structure or a $DO_{22}$ structure is an example of the order structure. The magnetic film 1 whose the crystalline structure includes the order structure have high magnetic anisotropy.

The magnetic film 1 may include one element selected from the group consisting of boron, carbon, or silver. Boron, carbon, or silver is included as an impurity in the magnetic film 1. Boron, carbon, or silver lowers a Curie point of the magnetic film 1. As will be described in detail below, the magnetic film 1 is manufactured by aligning the crystal in a magnetic field. When the Curie point of the magnetic film 1 is lowered, the crystal is easily aligned and regularity of the crystal is improved. As a result, magnetic anisotropy of the magnetic film 1 is improved.

As described above, even in the magnetic film 1 according to the first embodiment, the direction of the shape magnetic anisotropy coincides with the direction of the crystalline magnetic anisotropy. Therefore, the magnetic film 1 exhibits strong magnetic anisotropy and stability of the magnetization M1 is gained. The magnetization M1 of the magnetic film 1 has excellent thermal stability and can be used for, for example, a magnetic layer of a magnetoresistive effect element.

The example of the magnetic film 1 according to the first embodiment has been described above, but the present invention is not limited to the magnetic film illustrated in FIGS. 1 and 2.

For example, when the main vector direction of the c axis of the magnetic film 1 coincides with the major axis direction of the magnetic film 1, the major axis of the magnetic film 1 may be oriented in a direction other than the x direction in an xy plane. For example, the major axis of the magnetic film 1 may be the y direction.

Figure 3:
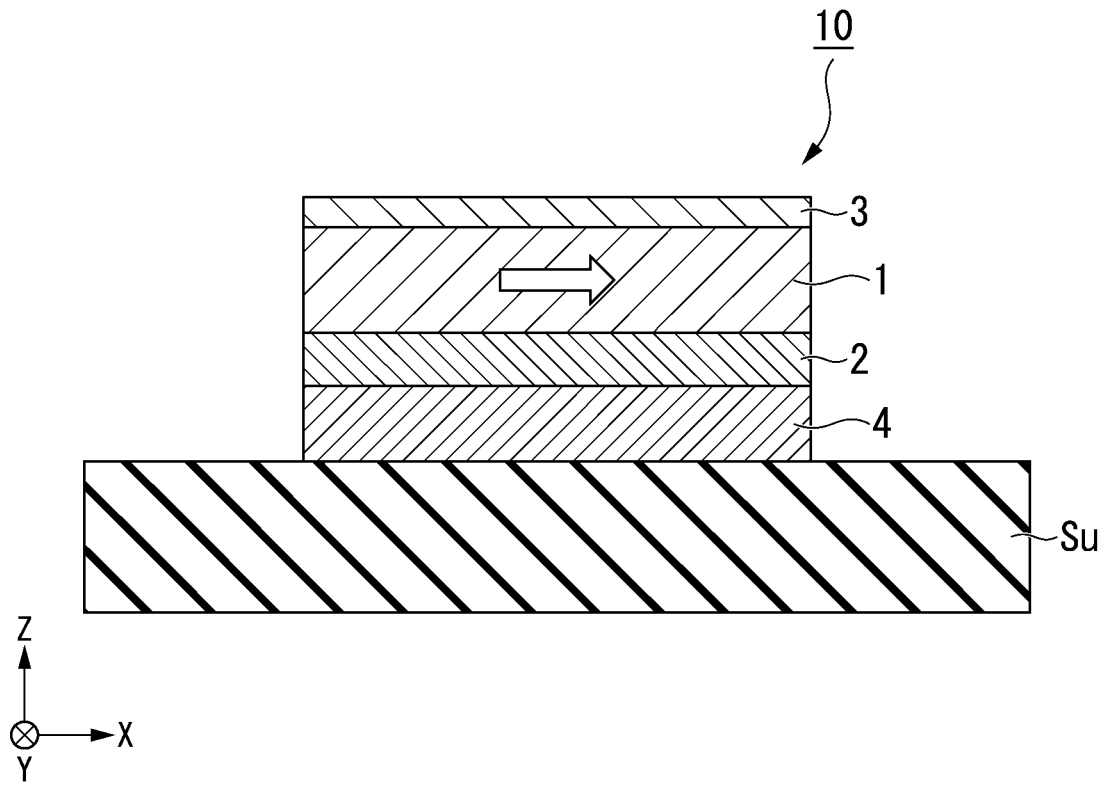
FIG. 3 is a sectional view illustrating another example of the magnetic film according to the first embodiment.

The magnetic film may include a layer other than a ferromagnetic layer. FIG. 3 is a sectional view illustrating another example of the magnetic film according to the first embodiment. A magnetic film 10 illustrated in FIG. 3 further includes an impurity absorption layer 2, a diffusion prevention layer 3, and an underlying layer 4 in addition to the magnetic film (ferromagnetic layer) 1 described in the first embodiment.

The impurity absorption layer 2 is stacked on one surface of the magnetic film 1. The impurity absorption layer 2 is in contact with, for example, a surface of the magnetic film 1 on the side of the support Su. When the magnetic film 10 is embedded in a magnetoresistive effect element 100 to be described below, the impurity absorption layer 2 is located further from a nonmagnetic film 30 than the magnetic film 1 (see FIG. 6).

The impurity absorption layer 2 includes one element selected from the group consisting of Mg, Ta, W, and Mo. The impurity absorption layer 2 is, for example, one oxide selected from the group consisting of Mg, Ta, W, and Mo.

The impurity absorption layer 2 draws boron, carbon, or silver included in the magnetic film 1. When boron, carbon, or silver included in the magnetic film 1 is drawn to the impurity absorption layer 2, atoms of the magnetic film 1 are mixed at the time of movement of boron, carbon, or silver. When the atoms are mixed, the atoms are easily moved, thereby accelerating crystallization. As a result, the magnetic anisotropy of the magnetic film 1 is improved.

When the magnetic film 10 is embedded in the magnetoresistive effect element to be described below, a film thickness of the impurity absorption layer 2 is, for example, equal to or less than a spin diffusion length of a material of the impurity absorption layer 2. It is possible to prevent a spin injected from the spin orbital torque wiring 40 to the magnetic film 1 from diffusing at the impurity absorption layer 2.

The diffusion prevention layer 3 is opposite to the impurity absorption layer 2 when the magnetic film 1 serves as a reference layer. When the magnetic film 10 is embedded in the magnetoresistive effect element 100 to be described below, the diffusion prevention layer 3 is closer to the nonmagnetic film 30 than the magnetic film 1 (see FIG. 6).

The diffusion prevention layer 3 includes, for example, one element selected from the group consisting of Ta, Mo, W, Cr, and V. The diffusion prevention layer 3 inhibits movement of atoms at the time of annealing. The diffusion prevention layer 3 inhibits, for example, movement of boron, carbon, or silver included in the magnetic film 1. Boron, carbon, or silver whose movement has been inhibited by the diffusion prevention layer 3 is moved to the side of the impurity absorption layer 2. In other words, the diffusion prevention layer 3 accelerates movement of boron, carbon, or silver included in the magnetic film 1 to the side of the impurity absorption layer 2.

When the magnetic film 10 is embedded in the magnetoresistive effect element 100 to be described below, the diffusion prevention layer 3 prevents magnetic atoms from diffusing from the magnetic film 1 to the side of the nonmagnetic film 30.

The thickness of the diffusion prevention layer 3 is, for example, equal to or less than three times a diameter of the constituent atoms, preferably equal to or less than two times the diameter of the atoms, and more preferably equal to or less than the diameter of the atoms. Here, the constituent atom is an atom in charge of the diffusion and is one atom selected from the group consisting of Ta, Mo, W, Cr, and V. When the thickness of the diffusion prevention layer 3 is to this degree, there is discontinuity in the atom in charge of the diffusion and an upper layer or a lower layer and a mixture layer of the atoms serve as diffusion prevention layers. When there is discontinuity in the atom in charge of the diffusion, it is possible to suppress the inhibition of magnetic coupling between the magnetic film 1 and another magnetic film by the atom in charge of the diffusion.

The underlying layer 4 is stacked in the z direction of the magnetic film 1. The underlying layer 4 is located, for example, between the magnetic film 1 and the support Su. The underlying layer 4 may be in contact with the magnetic film 1 with the impurity absorption layer 2 interposed therebetween or may be in direct contact with the magnetic film 1.

The underlying layer 4 is, for example, amorphous. The magnetic film 1 is easily influenced by a crystalline structure of a stacked lower surface. On the other hand, in the magnetic film 1 according to the embodiment, as will be described in detail below, the crystal is aligned with ignorance of the influence of the crystalline structure of the lower surface by applying a direct-current magnetic field. When the underlying layer 4 is amorphous, the influence of the underlying layer 4 on the magnetic film 1 decreases, and thus the c axis of the magnetic film 1 is easily aligned in a desired direction.

For example, when the underlying layer 4 has a crystalline structure, lattice mismatch between a crystal lattice of an alignment surface of the underlying layer 4 and a crystal lattice of a (111) surface of the magnetic film 1 may be equal to or greater than 5%. The lattice mismatch is mismatch between a periodic structure of the crystal of a stacked side and a periodic structure of the crystal of a stacking side. The lattice mismatch is an index expressed in |A−B|/A×100 when A is the periodic structure of the crystal of the stacked side and B is a periodic structure of the crystal of the stacking side. As the lattice mismatch is smaller, the crystal of the stacking side match the crystal of the stacked side and the crystals are in continuous contact with each other. The periodic structures A and B are integral multiples of lattice constants of the crystals.

When the magnetic film 1 is not influenced by the underlying layer 4, the stacking surface of the magnetic film 1 is easily aligned on the (111) surface which is a densest surface. Therefore, when the magnetic film 1 and the underlying layer 4 are discontinuous, the stacking surface of the magnetic film 1 becomes the (111) surface which is a densest surface. When the magnetic film 1 and the underlying layer 4 are discontinuous, the influence of the underlying layer 4 on the magnetic film 1 decreases and the c axis of the magnetic film 1 is easily aligned in a desired direction.

As described above, even in the magnetic film 10 illustrated in FIG. 3, the direction of the shape magnetic anisotropy coincides with the direction of the crystalline magnetic anisotropy. Therefore, the magnetic film 1 exhibits strong magnetic anisotropy and stability of the magnetization M1 is gained. The magnetization M1 of the magnetic film 1 has excellent thermal stability and can be used for, for example, a magnetic layer of a magnetoresistive effect element.

Second Embodiment (Magnetic Film)

Figure 4:
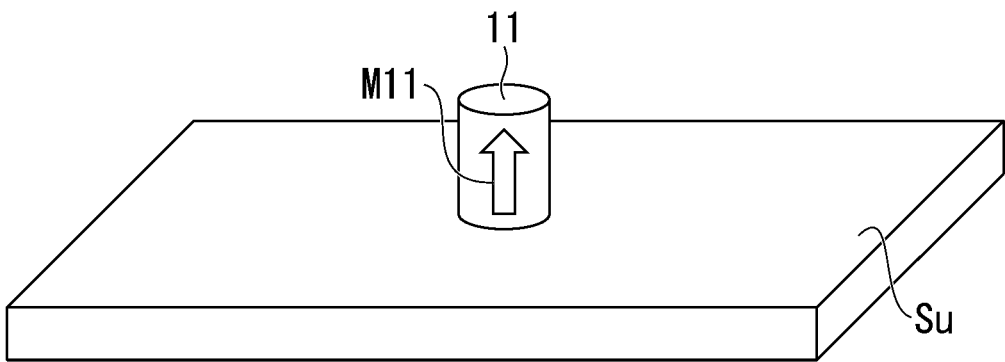
FIG. 4 is a perspective view illustrating a magnetic film according to a second embodiment.

FIG. 4 is a perspective view illustrating a magnetic film 11 according to a second embodiment. In FIG. 4, the support Su supporting the magnetic film 11 is illustrated at the same time. The magnetic film 11 is stacked on the support Su. The magnetic film 11 is formed of a single ferromagnetic layer.

The thickness of the magnetic film 11 in the z direction is longer than the width in any direction in an xy plane. The magnetic film 11 has a columnar body extending in the z direction. The magnetic film 1 may have a circular column or a prismatic column. The magnetic film 11 may have an expanded diameter or a contracted diameter in the z direction. The z direction of the magnetic film 11 illustrated in FIG. 4 is an example of the first direction.

The magnetic film 11 exhibits shape magnetic anisotropy in the z direction. Magnetization M11 of the magnetic film 11 is easily aligned in the major axis direction of the magnetic film 11 in which a diamagnetic field is weak.

Figure 5:
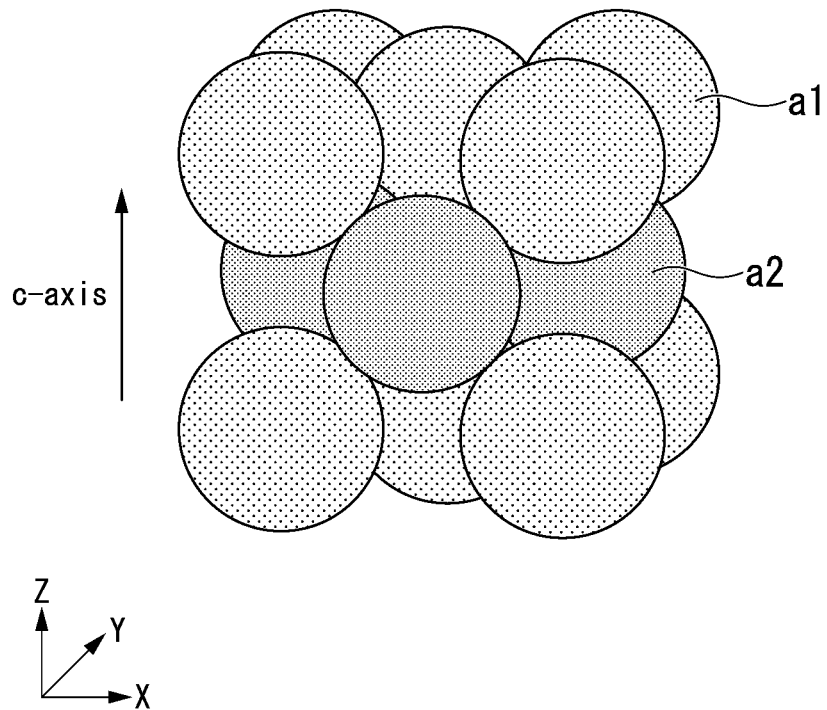
FIG. 5 is a schematic view illustrating a crystalline structure of the magnetic film according to the second embodiment.

FIG. 5 is a schematic view illustrating a crystalline structure of the magnetic film 11 according to the second embodiment. The magnetic film 11 is a magnetic substance with a tetragonal structure. The c axis of the magnetic film 1 is the z direction. Here, the c axis of the magnetic film 11 may not completely coincide with the z direction and the main vector direction of the c axis may be oriented in the z direction.

The magnetic film 11 exhibits crystalline magnetic anisotropy in the z direction. In the magnetic substance with a tetragonal structure, magnetization is easily aligned in the c axis direction and the magnetization M11 of the magnetic film 11 is easily aligned in the c axis direction.

The magnetization M11 of the magnetic film 11 is aligned in the z direction. In the magnetic film 11, a direction of the shape magnetic anisotropy coincides with a direction of the crystalline magnetic anisotropy. Since the direction of the shape magnetic anisotropy coincides with the direction of the crystalline magnetic anisotropy, the magnetic film 11 exhibits strong magnetic anisotropy in the z direction.

A material and a crystalline structure of the magnetic film 11 are the same as those of the foregoing magnetic film 1. The magnetic film 11 may include an impurity absorption layer, a diffusion prevention layer, and an underlying layer. In this case, the underlying layer preferably has a crystalline structure. The lattice mismatch between a crystal lattice of the underlying layer and a crystal lattice of a (100) surface of the magnetic film 11 is preferably equal to or less than 5%. This is because the c axis is aligned in the z direction in the magnetic film 11.

Third Embodiment (Method for Manufacturing Magnetic Film)

A method for manufacturing the magnetic film according to a third embodiment is a method for crystalizing an alloy while applying an external magnetic field in a predetermined temperature range. A magnetic film is manufactured by crystalizing an alloy in which a disorder structure and an order structure can be selected while applying a direct-current magnetic field in one direction under a temperature condition equal to or greater than a Curie temperature $T_{CD}$ of the disorder structure and equal to or less than a Curie temperature $T_{CO}$ of the order structure.

The alloy can take different states in accordance with a temperature at which the crystal is aligned, a constituent element ratio, or the like. Examples of the different states of the alloy are a disorder structure and an order structure. The order structure is a superlattice structure in which the first atom a1 and the second atom a2 are alternately arranged, as illustrated in FIGS. 2 and 5. The disorder structure is a structure in which the first atom a1 and the second atom a2 are mixed.

The alloy has, for example, a tetragonal structure. The alloy is, for example, one of a PtFe alloy, a PtCo alloy, a PdFe alloy, a FeNi alloy, a MnGa alloy, and a MnGe alloy.

A Curie temperature of the alloy differs between the disorder structure and the order structure. The Curie temperature $T_{CD}$ of the disorder structure is lower than the Curie temperature $T_{CO}$ of the order structure. For example, when a mixture ratio of Fe in the PtFe alloy is 50%, the Curie temperature $T_{CD}$ of the disorder structure is about 280° C. and the Curie temperature $T_{CO}$ of the order structure is about 460° C.

A crystallization temperature of the magnetic film is equal to or greater than the Curie temperature $T_{CD}$ of the disorder structure and equal to less than the Curie temperature $T_{CO}$ of the order structure. The crystallization temperature of the magnetic film is, for example, equal to or greater than 350° C.

The crystallization temperature of the magnetic film is a temperature at the time of crystallization of the atoms of the magnetic film and is a temperature at the time of application of a direct-current magnetic field. When the magnetic film is formed and crystalized at the same time, a film forming temperature is a crystallization temperature. When the magnetic film is formed and then crystalized by annealing, the annealing temperature is the crystallization temperature.

When the magnetic film is manufactured, an external magnetic field is applied. The external magnetic field is a direct-current magnetic field and is applied in one direction. When the magnetic film is formed and crystalized at the same time, the magnetic film is formed while applying the direct-current magnetic field. When the magnetic film is formed and then crystalized by annealing, the direct-current magnetic field is applied at the time of annealing. It is difficult to manufacture an apparatus that forms a magnetic film while applying an external magnetic field in a predetermined direction, and the configuration of the apparatus is complicated. Therefore, the external magnetic field is preferably applied at the time of annealing after the magnetic film is formed. That is, the crystallization is preferably performed after a film of the alloy is formed.

A direction in which the direct-current magnetic field is applied is preferably the c axis of the magnetic film. The direction of the c axis of the magnetic film is determined as the direction in which the direct-current magnetic field is applied. For example, in the case of the magnetic film 1 illustrated in FIG. 1, the direct-current magnetic field is applied in the x direction. The x direction is one direction in a surface of the stacked magnetic film. For example, in the case of the magnetic film 11 illustrated in FIG. 4, the direct-current magnetic field is applied in the z direction. The z direction is a thickness direction of the stacked magnetic film. The present invention is not limited to the cases of FIGS. 1 and 4 and the c axis of the magnetic film can be oriented in any direction.

In the c axis direction of the magnetic film, the crystalline magnetic anisotropy operates, as described above. When the direction of the shape magnetic anisotropy coincides with the direction of the crystalline magnetic anisotropy, the direct-current magnetic field is applied in the major axis direction of the magnetic film.

The magnitude of the direct-current magnetic field is, for example, equal to or less than 2 T. The magnitude of the direct-current magnetic field is, for example, equal to or greater than 0.3 T.

During an increase in temperature, the direct-current magnetic field may start to be applied from a temperature equal to or less than the Curie temperature $T_{CD}$ of the disorder structure. By applying the direct-current magnetic field from a time before the atoms of the magnetic film start to be aligned, the crystallization is accelerated in the direction in which the magnetic field is applied.

As described above, according to the method for manufacturing the magnetic film of the third embodiment, the c axis direction of the crystal can be oriented in any direction and the magnetization of the magnetic film can be oriented in any direction. According to the method for manufacturing the magnetic film of the third embodiment, the direction of the shape magnetic anisotropy and the direction of the crystalline magnetic anisotropy can be lined up.

Fourth Embodiment (Magnetoresistive Effect Element)

Figure 6:
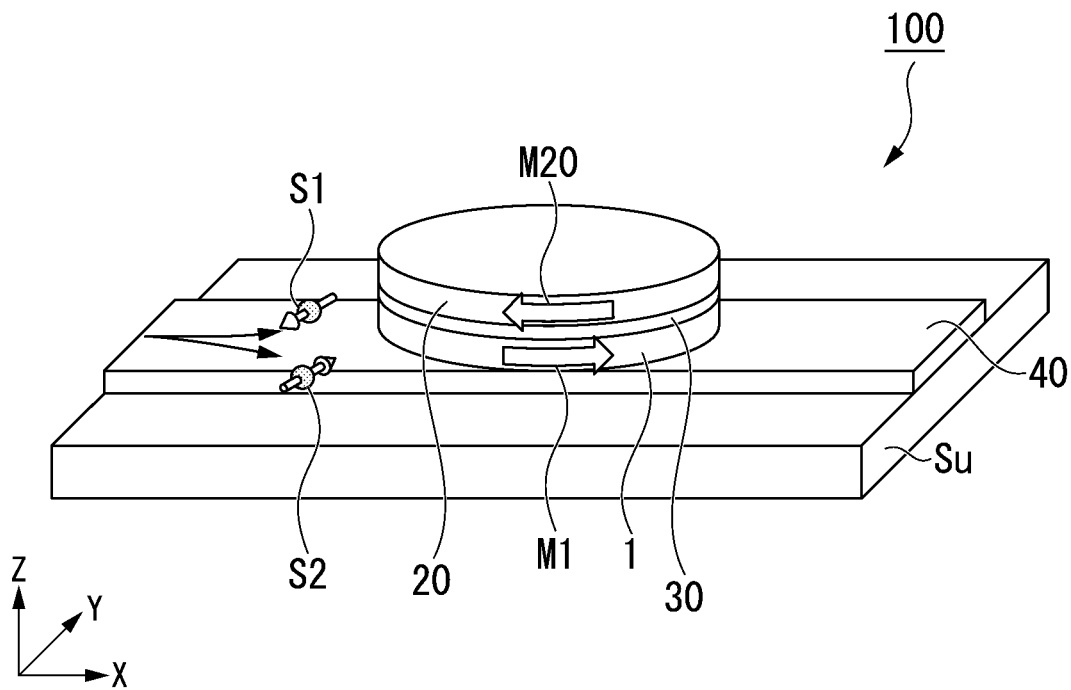
FIG. 6 is a sectional view illustrating a magnetoresistive effect element according to a fourth embodiment.

FIG. 6 is a perspective view illustrating the magnetoresistive effect element 100 according to a fourth embodiment. The magnetoresistive effect element 100 includes the magnetic film 1 according to the first embodiment, a second magnetic film 20, the nonmagnetic film 30, and the spin orbital torque wiring 40. In the magnetoresistive effect element 100, the magnetic film 10 may be used instead of the magnetic film 1.

The magnetoresistive effect element 100 is an element in which magnetization rotation is performed using a spin orbital torque (SOT) and is called a spin orbital torque type magnetoresistive effect element in some cases. In the magnetoresistive effect element 100, a resistance value changes in accordance with a difference in a relative angle of an alignment direction between the magnetization M1 of the magnetic film 1 and magnetization M20 of the second magnetic film 20. The magnetoresistive effect element 100 change a direction of the magnetization M1 of the magnetic film 1 and records data by flowing a writing current in the spin orbital torque wiring 40. The written data is read by flowing a reading current between the second magnetic film 20 and one end of the spin orbital torque wiring 40.

The magnetic film 1 is in contact with the spin orbital torque wiring 40. In the magnetic film 1, the magnetization M1 is inverted by a spin injected from the spin orbital torque wiring 40. The magnetic film 1 is called a free layer in some cases. In the magnetic film 1, for example, magnetization inversion is easier than in the second magnetic film 20.

The spin orbital torque wiring 40 includes one of a metal, an alloy, an intermetallic compound, a metal boride, a metal carbide, a metal silicide, and a metal phosphide having a function of generating a spin current by a spin Hall effect when a current flows.

The spin Hall effect is a phenomenon in which a spin current is caused in a direction orthogonal to a flow direction of a current based on spin orbital interaction when the current flows. The spin Hall effect is common to a normal Hall effect in that traveling (moving) charges (electrons) curved a traveling (moving) direction. In the normal Hall effect, a traveling direction of charged particles traveling in a magnetic field is curve by a Lorentz force. On the other hand, in the spin Hall effect, even when there is no magnetic field, a movement direction of a spin is curve as electrons move (a current flows).

The spin orbital torque wiring 40 generates a spin current by the spin Hall effect generated by flowing a current. When the current flows in the spin orbital torque wiring 40, a first spin S1 aligned in one direction and a second spin S2 aligned in an opposite direction to the first spin S1 are each curve in a direction orthogonal to the flowing direction of each current. For example, the first spin S1 aligned in the −y direction is curve in the +z direction and the second spin S2 aligned in the +y direction is curve in the −z direction.

In a nonmagnetic substance (a substance which is not a ferromagnetic substance), the number of electrons of the first spin S1 generated by the spin Hall effect is the same as the number of electrons of the second spin S2. That is, the number of electrons of the first spin S1 oriented in the +z direction is the same as the number of electrons of the second spin S2 oriented in the −z direction. The first spin S1 and the second spin S2 flow in directions in which uneven distribution of spins is cancelled. Since flows of charges are mutually cancelled in the movement of the first spin S1 and the second spin S2 in the z direction, a current amount becomes zero. A spin current not involving a current is particularly called a pure spin current.

When a flow of electrons of the first spin S1 is $J_\uparrow$, a flow of the electrons of the second spin S2 is $J_\downarrow$, and a spin current is $J_S$, $J_S=J_\uparrow-J_\downarrow$ is defined. The spin current $J_S$ is generated in the z direction. The first spin S1 is injected into the magnetic film 1 in contact with the spin orbital torque wiring 40. The spin orbital torque wiring 40 applies, for example, a spin orbital torque with which the magnetization M1 of the magnetic film 1 to the magnetization M1 of the magnetic film 1 can be inverted.

A main component of the spin orbital torque wiring 40 is preferably a nonmagnetic heavy metal. The heavy metal is a metal that has specific gravity equal to or greater than yttrium (Y). The nonmagnetic heavy metal is preferably a nonmagnetic metal with a large atomic number equal to or greater than atomic number 39 that has d electrons and f electrons in the outermost shell. The spin orbital torque wiring 40 is, for example, Hf, Ta, or W. In the nonmagnetic heavy metal, spin orbital interaction is generated stronger than that in other metals. The spin Hall effect is generated by the spin orbital interaction, spins are easily distributed unevenly in spin orbital torque wiring 40, and the spin current $J_S$ is easily generated.

The spin orbital torque wiring 40 may include a magnetic metal. The magnetic metal is a ferromagnetic metal or an anti-ferromagnetic metal. A very small amount of magnetic metal included in a nonmagnetic substance is a scattering factor of a spin. The very small amount is, for example, equal to or less than 3% of a total molar ratio of elements of the spin orbital torque wiring 40. When a spin scatters due to a magnetic metal, the spin orbital interaction is enhanced, and thus generation efficiency of a spin current with respect to a current is improved.

The spin orbital torque wiring 40 may include a topological insulator. The topological insulator is a substance that has an insulator or a high resistor therein and has a metal state in which a spin is polarized on its surface. In the topological insulator, an internal magnetic field is generated by a spin orbital interaction. The topological insulator expresses a new topological phase by the effect of the spin orbital interaction even when there is no external magnetic field. The topological insulator can generate a pure spin current with high efficiency by the strong spin orbital interaction and broken inversion symmetry in the edge.

The topological insulator is, for example, SnTe, $Bi_{1.5}Sb_{0.5}Te_{1.7}Se_{1.3}$, $TlBiSe_2$, $Bi_2Te_3$, $(Bi_{1-x}Sb_x)_2Te_3$, or the like. The topological insulator can generate a spin current with high efficiency.

In the magnetoresistive effect element 100 illustrated in FIG. 6, a spin injected from the spin orbital torque wiring 40 is aligned in the y direction and the magnetization M1 is aligned in the x direction. The magnetoresistive effect element 100 is referred to as Type-X in some cases. The direction of the injected spin is orthogonal to the alignment direction of the magnetization M1. A torque rotated at 90° by a spin is applied to the magnetization M1 and magnetization inversion is performed fast. To stabilize the inversion of the magnetization M1 of the magnetoresistive effect element 100, it is preferably to apply a magnetic field in the z direction.

The second magnetic film 20 includes a ferromagnetic substance. The second magnetic film 20 is a ferromagnetic layer. The ferromagnetic layer is, for example, a metal selected from a group consisting of Cr, Mn, Co, Fe, and Ni, an alloy including one or more of the metals, an alloy including such a metal and one element or more of B, C, and N, or the like. The ferromagnetic layer is, for example, a Co—Fe, Co—Fe—B, Ni—Fe, or Co—Ho alloy, a Sm—Fe alloy, a Fe—Pt alloy, a Co—Pt alloy, or a CoCrPt alloy.

The second magnetic film 20 may include a Heusler alloy. The Heusler alloy includes an intermetal compound that has a chemical composition of XYZ or $X_2YZ$. X is a noble metal or a transition metal element of a Co, Fe, Ni, or Cu group on the periodic table, Y is a kind of element of X or a transition metal of a Mn, V, Cr, or Ti group, and Z is a typical element from group III to group V. The Heusler alloy is, for example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, or the like. The Heusler alloy has high spin polarizability.

"Nonmagnetic Film"

The nonmagnetic film 30 is located between the magnetic film 1 and the second magnetic film 20. The nonmagnetic film 30 is stacked on one surface of the magnetic film 1.

The nonmagnetic film 30 is formed of, for example, a nonmagnetic insulator, semiconductor, or metal. The nonmagnetic insulator is, for example, a material in which $Al_2O_3$, $SiO_2$, MgO, $MgAl_2O_4$, and some of Al, Si, and Mg are replaced by Zn, Be, or the like. The material has a large bandgap and an excellent insulation property. When the nonmagnetic film 30 is formed of a nonmagnetic insulator, the nonmagnetic film 30 is a tunnel barrier layer. The nonmagnetic metal is, for example, Cu, Au, Ag, or the like. The nonmagnetic semiconductor is, for example, Si, Ge, $CuInSe_2$, $CuGaSe_2$, $Cu(In, Ga)Se_2$, or the like.

In the magnetoresistive effect element 100 according to the fourth embodiment, the magnetization M1 is stable since the magnetic film 1 exhibits strong magnetic anisotropy. Accordingly, even when an unexpected external force such as heat is applied, data can be stably retained.

Figure 7:
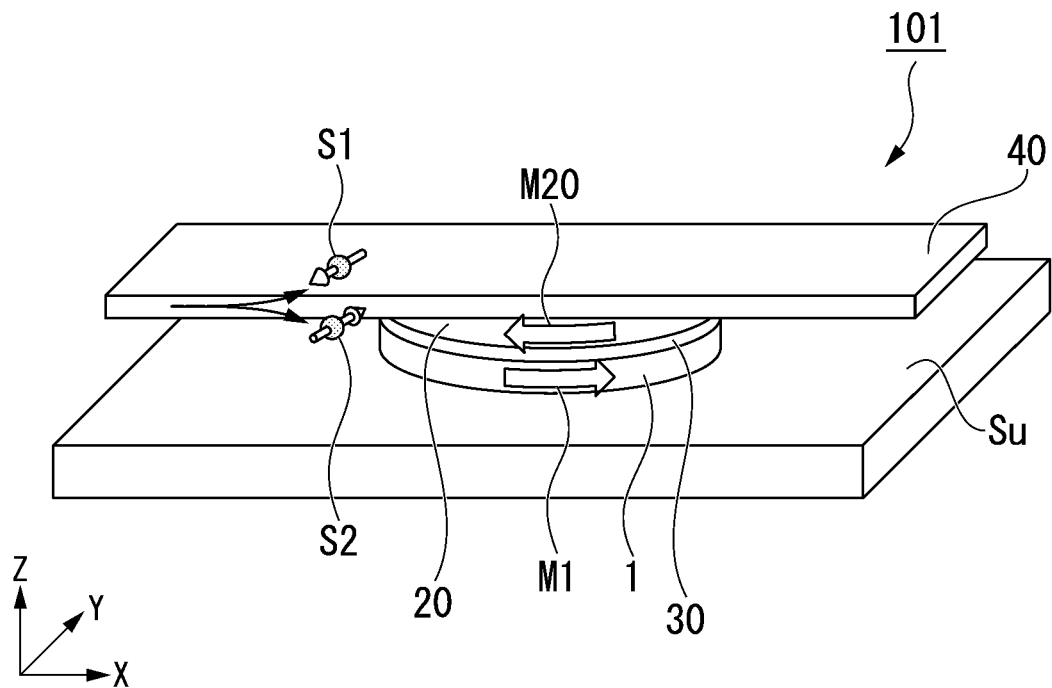
FIG. 7 is a sectional view illustrating a magnetoresistive effect element according to a first modified example.

FIG. 7 is a perspective view illustrating a magnetoresistive effect element 101 according to a first modified example of the fourth embodiment. The magnetoresistive effect element 101 according to the first modified example differs from the magnetoresistive effect element 100 illustrated in FIG. 6 in that the spin orbital torque wiring 40 is in contact with the second magnetic film 20.

In the magnetoresistive effect element 101, the magnetization M20 of the second magnetic film 20 is inverted by a spin injected from the spin orbital torque wiring 40. Accordingly, the magnetic film 1 is a fixed layer and the second magnetic film 20 is a free layer. In this case, in the magnetic film 1, for example, magnetization inversion is difficult compared to the second magnetic film 20.

In the magnetoresistive effect element 101, a resistance value changes in accordance with a difference in a relative angle of an alignment direction between the magnetization M1 of the magnetic film 1 and magnetization M20 of the second magnetic film 20. Data recorded by the magnetoresistive effect element 101 is changed when a direction of magnetization between the magnetization M1 and the magnetization M20 is changed. The magnetic film 1 exhibits strong magnetic anisotropy and the magnetization M1 is stabilized, and thus the magnetoresistive effect element 101 can retain the data stably.

Figure 8:
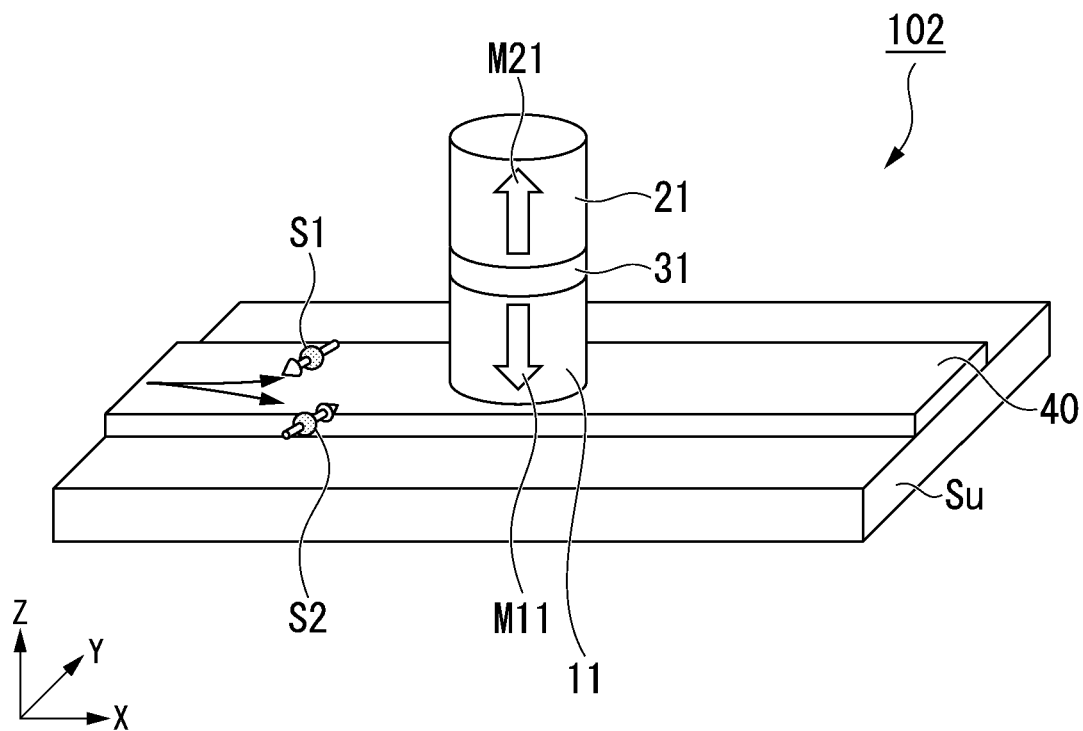
FIG. 8 is a sectional view illustrating a magnetoresistive effect element according to a second modified example.

FIG. 8 is a perspective view illustrating a magnetoresistive effect element 102 according to a second modified example of the fourth embodiment. The magnetoresistive effect element 102 according to the second modified example differs from the magnetoresistive effect element 100 in that a magnetic film 11 is included instead of the magnetic film 1. The magnetic film 11 is a magnetic film described in the second embodiment.

The magnetoresistive effect element 102 includes the magnetic film 11, a second magnetic film 21, and a nonmagnetic film 31. The nonmagnetic film 31 is located between the magnetic film 11 and the second magnetic film 21. The magnetization M11 of the magnetic film 11 and magnetization M21 of the second magnetic film 21 are aligned in the z direction. The second magnetic film 21 and the nonmagnetic film 31 correspond to the second magnetic film 20 and the nonmagnetic film 30, respectively.

In the magnetoresistive effect element 102 illustrated in FIG. 8, a spin injected from the spin orbital torque wiring 40 is aligned in the y direction and the magnetization M11 is aligned in the z direction. The magnetoresistive effect element 102 is referred to as Type-Z in some cases. The direction of the injected spin and the alignment direction of the magnetization M11 are orthogonal to each other. A torque rotated at 90° by a spin is applied to the magnetization M11 and magnetization inversion is performed fast. To stabilize inversion of the magnetization M11 of the magnetoresistive effect element 102, it is preferably to apply a magnetic field in the x direction.

The magnetoresistive effect element 102 of Type-Z is said to have a more excellent data retention force than the magnetoresistive effect element 100 of Type-X. On the other hand, Type-Z does not mean that a data retention force is sufficient. In the magnetoresistive effect element 102 according to the second modified example, the magnetic film 11 exhibits strong magnetic anisotropy and thus the stability of the magnetization M11 is excellent. Accordingly, the magnetoresistive effect element 102 can retain data stably even when an unexpected external force such as heat is applied.

In the magnetoresistive effect element 102 according to the second modified example, as in the first modified example, the spin orbital torque wiring 40 may be in contact with the second magnetic film 21.

Figure 9:
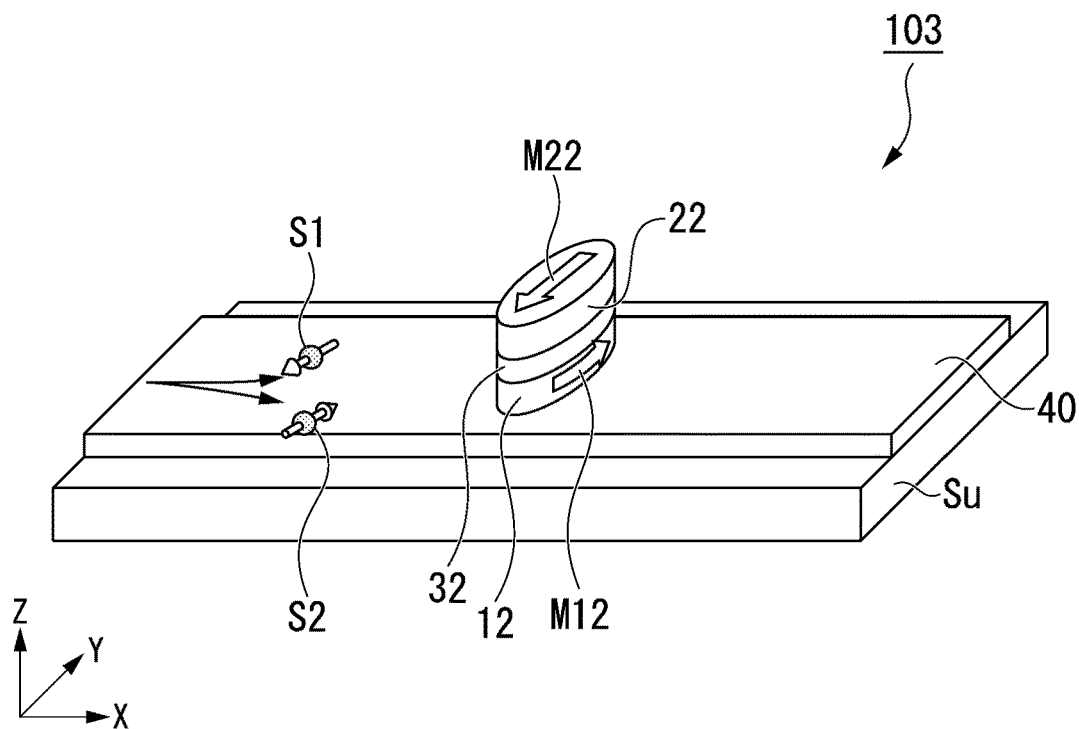
FIG. 9 is a sectional view illustrating a magnetoresistive effect element according to a third modified example.

FIG. 9 is a perspective view illustrating a magnetoresistive effect element 103 according to a third modified example of the fourth embodiment. The magnetoresistive effect element 103 according to the third modified example differs from the magnetoresistive effect element 100 in a major axis direction of a magnetic film 12.

The magnetoresistive effect element 102 includes the magnetic film 12, a second magnetic film 22, and a nonmagnetic film 32. The nonmagnetic film 32 is located between the magnetic film 12 and the second magnetic film 22. Magnetization M12 of the magnetic film 12 and magnetization M22 of the second magnetic film 22 are aligned in the y direction. The second magnetic film 22 and the nonmagnetic film 32 correspond to the second magnetic film 20 and the nonmagnetic film 30, respectively.

In the magnetic film 12, a major axis direction is the y direction. The c axis direction of the magnetic film 12 is the y direction. In the magnetic film 12, the direction of the shape magnetic anisotropy and the direction of the crystalline magnetic anisotropy are lined up. Accordingly, the magnetic film 12 exhibits strong magnetic anisotropy.

In the magnetoresistive effect element 103 illustrated in FIG. 9, a spin injected from the spin orbital torque wiring 40 is aligned in the y direction and the magnetization M12 is aligned in the y direction. The magnetoresistive effect element 103 is referred to as Type-Y in some cases. The direction of the injected spin and the alignment direction of the magnetization M11 are inverted. A torque rotated at 180° by a spin is applied to the magnetization M12 and magnetization inversion is performed fast. The speed of the magnetization inversion of the magnetoresistive effect element 103 of Type-Y is slower than the speed of the magnetization inversion of the magnetoresistive effect element 100 of Type-X and the magnetoresistive effect element 102 of Type-Z. On the other hand, since an adverse torque of 180° is applied to the magnetization M12, stable magnetization inversion can be performed even under a nonmagnetic field in the magnetoresistive effect element 103 of Type-Y In the magnetoresistive effect element 103 according to the third modified example, the magnetic film 12 exhibits strong magnetic anisotropy and thus the stability of the magnetization M12 is excellent. Accordingly, the magnetoresistive effect element 103 can retain data stably even when an unexpected external force such as heat is applied.

In the magnetoresistive effect element 103 according to the third modified example, as in the first modified example, the spin orbital torque wiring 40 may be in contact with the second magnetic film 22.

The example of the magnetoresistive effect element according to the fourth embodiment has been described specifically above, but the magnetoresistive effect element is not limited to the configuration. For example, the magnetoresistive effect element may not include the spin orbital torque wiring 40. The magnetoresistive effect element performs magnetization inversion using a spin transfer torque (STT) by flowing a writing current in the z direction.

The magnetoresistive effect element is an example of a use aspect of the magnetic film according to the first and second embodiments and the present invention is not limited to this case.

Figure 10:
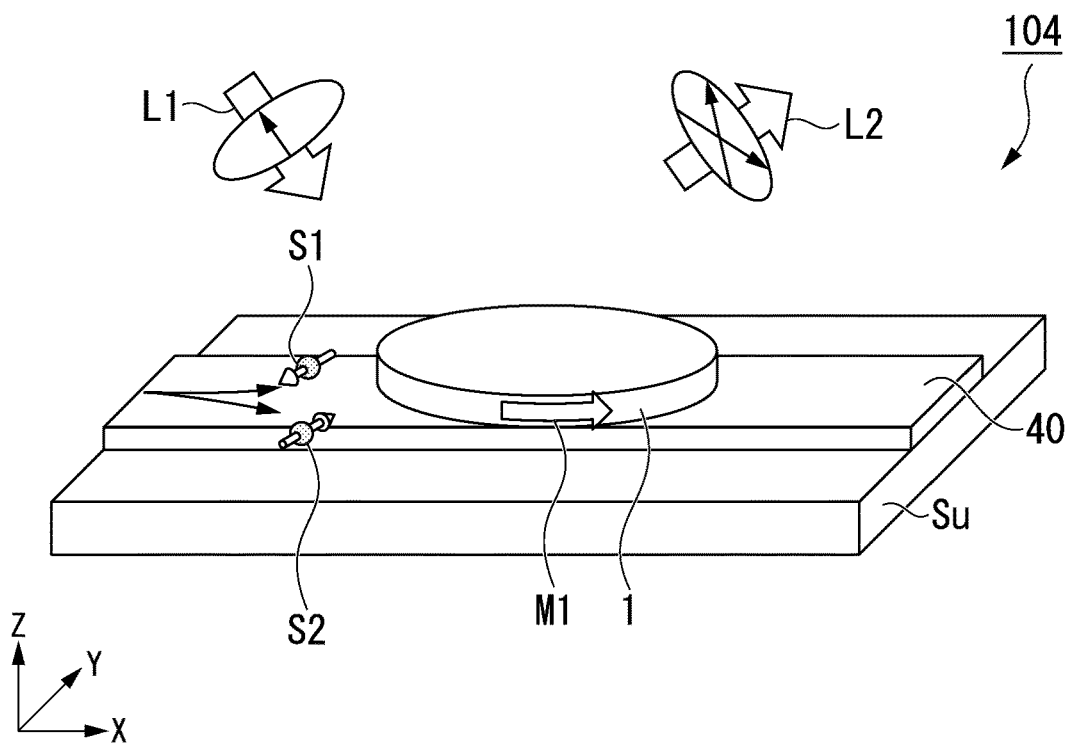
FIG. 10 is a perspective view illustrating a magneto-optical element in which a magnetic film according to the first embodiment is used.

For example, FIG. 10 is a perspective view illustrating a magneto-optical element in which the magnetic film according to the first embodiment is used. A magneto-optical element 104 illustrated in FIG. 10 includes the magnetic film 1 and the spin orbital torque wiring 40. In the magneto-optical element 104, a direction of the magnetization M1 of the magnetic film 1 is changed by a spin injected from the spin orbital torque wiring 40.

In the magneto-optical element 104, light L1 is incident on the magnetic film 1 to evaluate light L2 reflected from the magnetic film 1. When an alignment direction of magnetization is changed by the magnetic Kerr effect, a deflection state of the reflected light L2 is changed. The magneto-optical element 104 can be used as a video display device in which a difference in the deflection state of the light L2 is used.

In the magneto-optical element 104 illustrated in FIG. 10, the magnetic film 1 exhibits strong magnetic anisotropy, and the stability of the magnetization M1 is excellent. Accordingly, in the magneto-optical element 104, a change in a display image or the like can be inhibited from occurring even when an unexpected external force such as heat is applied. Here, the example in which the magnetic film 1 is used for the magneto-optical element 104 has been described, but the magnetic film 11 or 12 may be used.

Fifth Embodiment (Magnetic Array)

Figure 11:
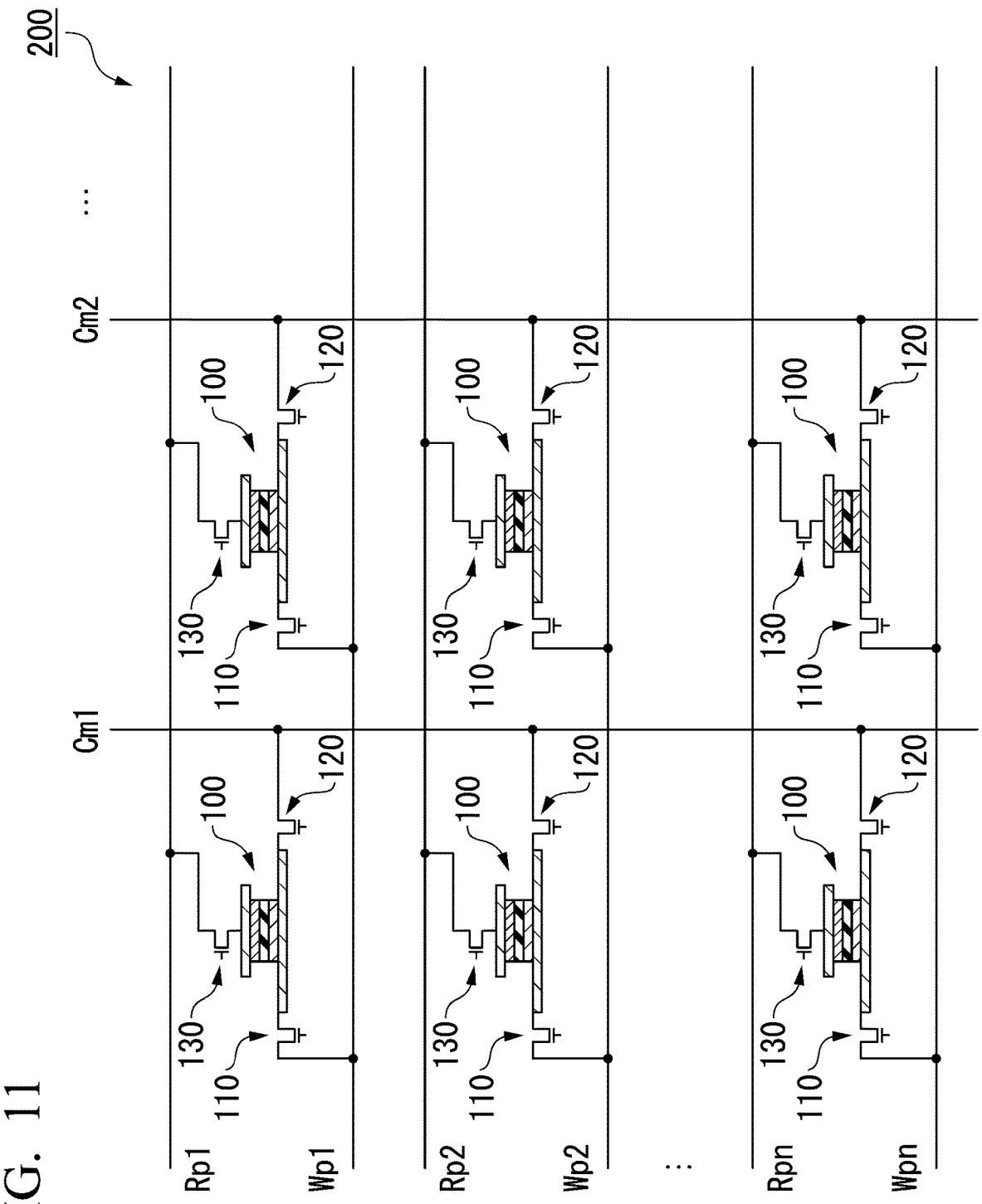
FIG. 11 is a schematic view illustrating a magnetic array according to a fifth embodiment.

FIG. 11 is a schematic view illustrating a magnetic array according to a fifth embodiment. A magnetic array 200 includes the plurality of magnetoresistive effect elements 100, a plurality of first wirings Wp1 to Wpn, a plurality of second wirings Cm1 to Cmn, a plurality of third wirings Rp1 to Rpn, a plurality of first switching elements 110, a plurality of second switching elements 120, and a plurality of third switching elements 130.

The magnetic array 200 can be used for, for example, a magnetic memory, a product-sum operator, or a neuromorphic device. In the magnetic array 200, the magnetoresistive effect element 101, 102, or 103 or the magneto-optical element 104 may be used instead of the magnetoresistive effect element 100. When the magneto-optical element 104 is used, the magnetic array 200 serves as a video display device.

<First, Second, and Third Wirings>

The first wirings Wp1 to Wpn are writing writings. The first wirings Wp1 to Wpn electrically connect a power supply to one or more magnetoresistive effect elements 100. The power supply is connected to one end of the magnetic array 200 at the time of use.

The second wirings Cm1 to Cmn are common wirings. The common wirings are wirings which can be used at the time of both writing and reading of data. The second wirings Cm1 to Cmn electrically connect a reference potential to one or more magnetoresistive effect elements 100. The reference potential is, for example, a grounding potential. The second wirings Cm1 to Cmn may be provided in each of the plurality of magnetoresistive effect elements 100 or may be provided throughout the plurality of magnetoresistive effect elements 100.

The third wirings Rp1 to Rpn are reading wirings. The third wirings Rp1 to Rpn electrically connect a power supply to one or more magnetoresistive effect elements 100. The power supply is connected to one end of the magnetic array 200 at the time of use.

<First, Second, and Third Switching Elements>

The first switching element 110, the second switching element 120, and the third switching element 130 illustrated in FIG. 11 are connected to each of the plurality of magnetoresistive effect elements 100. The first switching elements 110 are connected between the magnetoresistive effect elements 100 and the first wirings Wp1 to Wpn. The second switching elements 120 are connected between the magnetoresistive effect elements 100 and the second wirings Cm1 to Cmn. The third switching elements 130 are connected between the magnetoresistive effect elements 100 and the third wirings Rp1 to Rpn.

When the first switching elements 110 and the second switching elements 120 are turned on, writing currents flow between the first wirings Wp1 to Wpn and the second wirings Cm1 to Cmn connected to the predetermined magnetoresistive effect elements 100. When the first switching elements 110 and the third switching elements 130 are turned on, reading currents flow between the second wirings Cm1 to Cmn and the third wirings Rp1 to Rpn connected to the predetermined magnetoresistive effect elements 100.

The first switching element 110, the second switching element 120, and the third switching element 130 are elements that control a flow of a current. The first switching element 110, the second switching element 120, and the third switching element 130 are transistors, elements using a change in a phase of a crystalline layer, such as an ovonic threshold switch (OTS), elements using a change in a band structure, such as a metal-insulator transition (MIT) switch, elements using a breakdown voltage, such as a Zener diode and an avalanche diode, or elements of which conductivity is changed with a change in an atom position.

Any of the first switching element 110, the second switching element 120, and the third switching element 130 may be commonly used for the magnetoresistive effect element 100 connected to the same wiring. For example, when the first switching element 110 is shared, one first switching element 110 is provided upstream of the first wirings Wp1 to Wpn. For example, when the second switching element 120 is shared, one second switching element 120 is provided upstream of the second wirings Cm1 to Cmn. For example, when the third switching element 130 is shared, one third switching element 130 is provided upstream of the third wirings Rp1 to Rpn.

Figure 12:
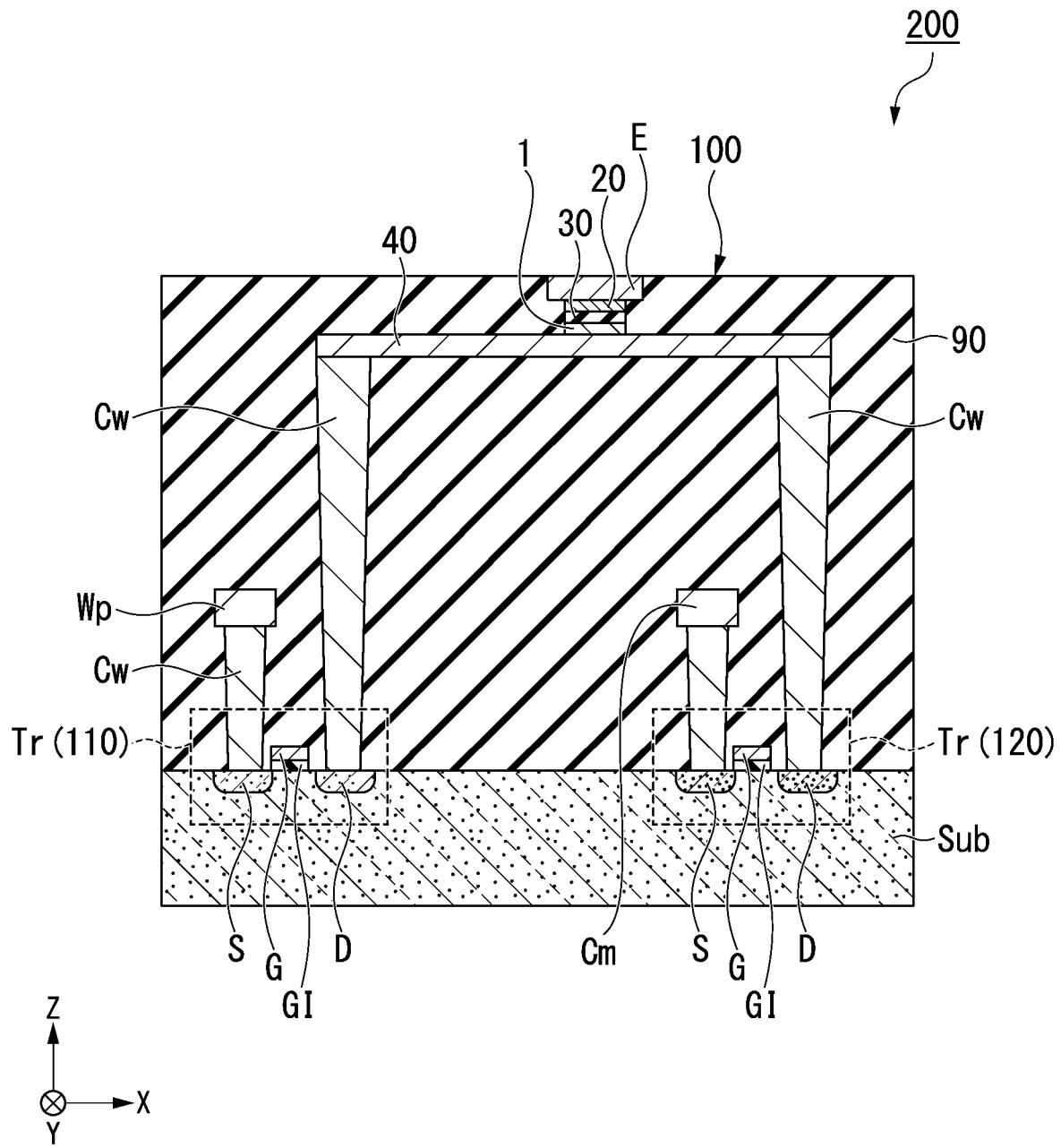
FIG. 12 is a sectional view illustrating main units of the magnetic array according to the fifth embodiment.

FIG. 12 is a sectional view illustrating main units of the magnetic array 200 according to the fifth embodiment. FIG. 12 illustrates a cross-sectional surface of one magnetoresistive effect element 100 in FIG. 11 taken along an xz plane which passes through a center of the width of the spin orbital torque wiring 40 in the y direction.

The first switch element 110 and the second switching element 120 illustrated in FIG. 12 are transistors Tr. The transistor Tr includes a gate electrode G, a gate insulation film GI, and a source region S and a drain region D formed in a substrate Sub. The substrate Sub is, for example, a semiconductor substrate. The third switching element 130 is electrically connected to an electrode E and is located at different position in the y direction.

The electrode E is formed of a material with conductivity. The electrode E is formed of, for example, a transparent electrode material. The electrode E is, for example, an indium zinc oxide (IZO), an indium tin oxide (ITO), a tin oxide ($SnO_2$), an antimony-tin oxide (ATO), a zinc oxide (ZnO), a fluorine-doped tin oxide (FTO), an indium oxide ($In_2O_3$), or the like. When the electrode E is transparent, an alignment direction of the magnetization M20 or the magnetization M1 can be read from the outside.

Each transistor Tr and the magnetoresistive effect element 100 are electrically connected via a connection wiring Cw. The connection wiring Cw includes a material with conductivity. The connection wiring Cw extends in, for example, the z direction. The connection wiring Cw is, for example, a via wiring formed in an opening of an insulation layer 90.

The magnetoresistive effect element 100 and the transistor Tr are electrically isolated from each other by the insulation layer 90 except for the connection wiring Cw. The insulation layer 90 is an insulation layer that insulates wirings or elements of multilayer wirings. The insulation layer 90 is, for example, a silicon oxide ($SiO_x$), a silicon nitride (SiNO, a silicon carbide (SiC), a chromium nitride, a silicon carbonitride (SiCN), a silicon oxynitride (SiON), an aluminum oxide ($Al_2O_3$), a zirconium oxide ($ZrO_x$), or the like. The insulation layer 90 corresponds to the support Su according to the first, second, and fourth embodiments.

In the magnetic array 200 according to the fifth embodiment, since the magnetic film 1 exhibits strong magnetic anisotropy, data can be stably retained and reliability is high.

The preferred embodiments of the present invention have been described in detail. The characteristic configurations in the embodiments and the modified examples may be combined.

EXAMPLES

Example 1

A magnetic film formed of a FePt alloy with a thickness of 10 nm was formed on a support. A ratio of Fe included in the FePt alloy was set to 50%. The magnetic film was formed on one surface of the support and shape anisotropy was not given in an XY plane. The formed magnetic film was subjected to annealing while applying an external magnetic film of 1 T in one direction (which is assumed to be the x direction) of an in-plane direction of the magnetic film. The Curie temperature of a disorder structure of the FePt alloy according to Example 1 is 280° C. and the Curie temperature of an order structure is 460° C. The annealing was performed at 350° C. for 5 hours. The external magnetic field was applied from the room temperature.

Figure 13:
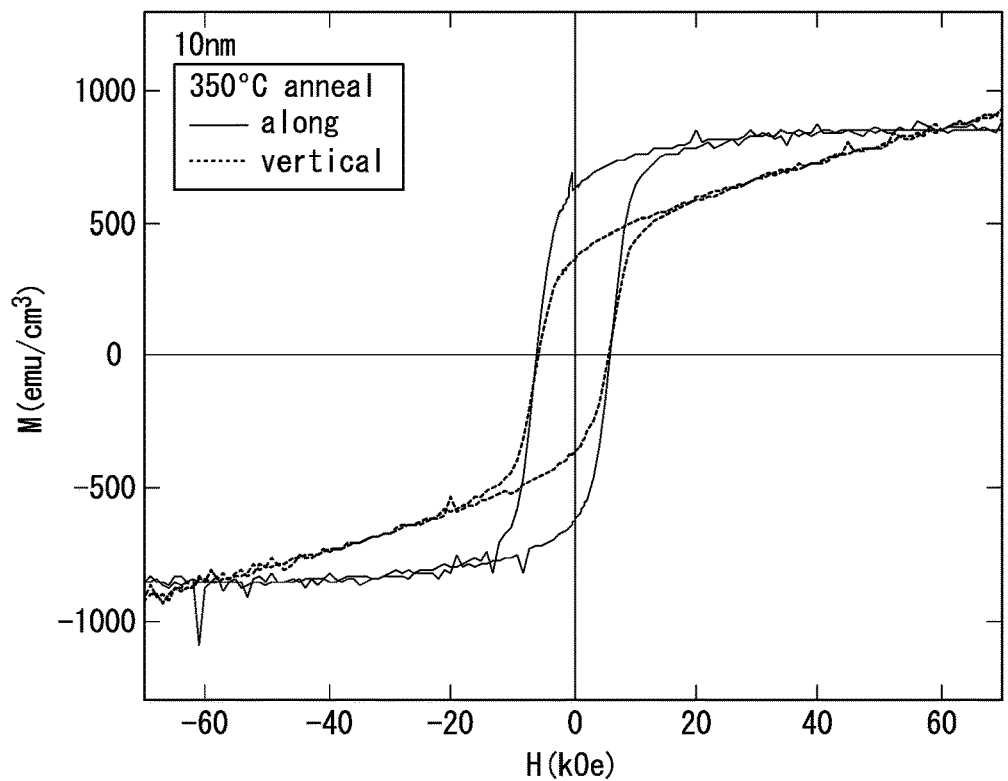
FIG. 13 is a diagram illustrating a measurement result of a magnetization curve according to Example 1.
Figure 14:
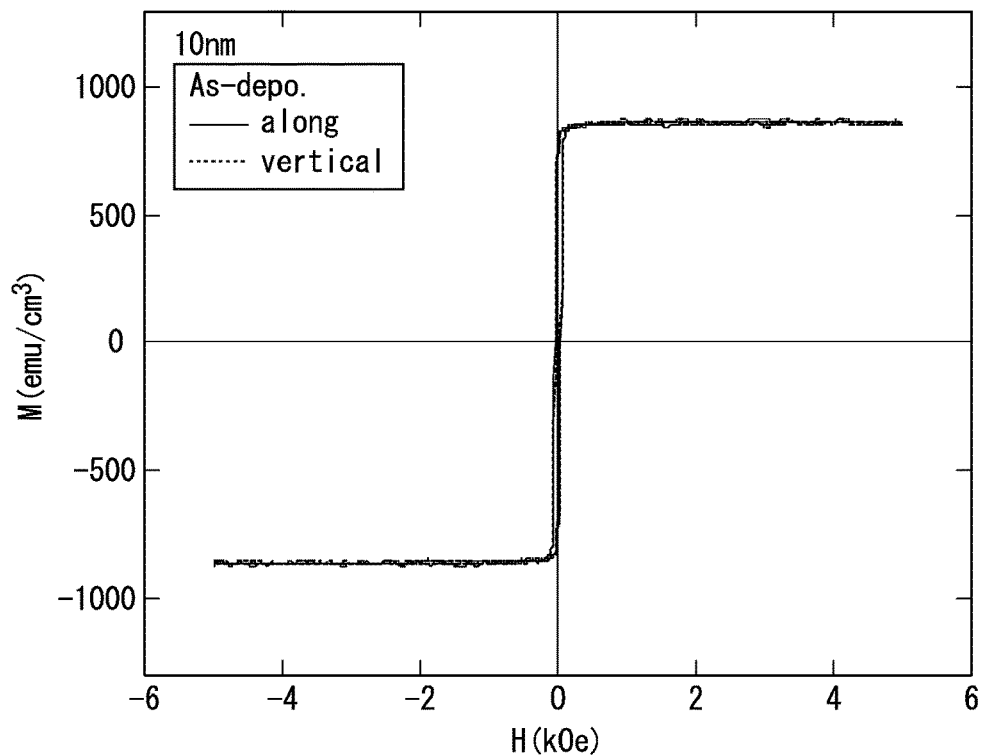
FIG. 14 is a diagram illustrating a measurement result of a magnetization curve according to Comparative Example 1.

Then, a magnetization curve of the magnetic film after the annealing was obtained. The magnetization curve was obtained in each of the x direction and the y direction orthogonal to the x direction. The x direction is the same direction as a direction in which an external magnetic field is applied to the magnetic film and the magnetization curve in the x direction in FIGS. 13 and 14 to be described below is indicated as along. The y direction is a direction orthogonal to the direction in which an external magnetic field is applied to the magnetic film and the magnetization curve in the y direction in the following FIGS. 13 and 14 is indicated as vertical. The magnetization curve was obtained with a vibration sample magnetometer (VSM).

FIG. 13 is a diagram illustrating a measurement result of a magnetization curve of a magnetic film according to Example 1. The horizontal axis represents magnitude of an external magnetic field applied to measure a magnetization curve and the vertical axis represents magnitude of magnetization. As illustrated in FIG. 13, a behavior of the magnetization curve differs in the x and y directions. It can be understood that residual magnetization in the condition that the external magnetic field is zero is greater in the magnetization curve in the x direction than in the magnetization curve in the y direction, and the magnetic film is aligned in the x direction. That is, magnetization of the magnetic film 1 according to Example 1 was aligned in the direction in which the external magnetic field is applied at the time of annealing.

Comparative Example 1

Comparative Example 1 differs from Example 1 in that annealing is not performed after the magnetic film is formed. FIG. 14 is a diagram illustrating a measurement result of a magnetization curve of a magnetic film according to Comparative Example 1. As illustrated in FIG. 14, magnetization of the magnetic film according to Comparative Example 1 is not aligned in an in-plane direction.

When Example 1 and Comparative Example 1 are compared, it can be understood that the magnetization is aligned in a desired direction by applying the external magnetic field at the time of annealing.

REFERENCE SIGNS LIST

1 Magnetic film
2 Impurity absorption layer
3 Diffusion prevention layer
4 Underlying layer
10, 11, 12 Magnetic film
20, 21, 22 Second magnetic film
30, 31, 32 Nonmagnetic film
40 Spin orbital torque wiring
90 Insulation layer
100, 101, 102, 103 Magnetoresistive effect element
104 Magneto-optical element
110 First switching element
120 Second switching element
130 Third switching element
200 Magnetic array
M1, M11, M12, M20, M21, M22 Magnetization

What is claimed is:

1. A magnetic film comprising:
a ferromagnetic layer,
wherein the ferromagnetic layer has a thickness or a width in a first direction which is longer than a thickness or a width in another direction, a crystalline structure is a tetragonal structure, and a main vector direction of a c axis of the tetragonal structure is the first direction, and
wherein the first direction intersects a thickness direction of the ferromagnetic layer.

2. The magnetic film according to claim 1, wherein the first direction is a thickness direction of the ferromagnetic layer.

3. The magnetic film according to claim 1, wherein the ferromagnetic layer has an $L_0$ structure or a $DO_{22}$ structure.

4. The magnetic film according to claim 1, wherein the ferromagnetic layer includes one of the group consisting of a PtFe alloy, a PtCo alloy, a PdFe alloy, an FeNi alloy, a MnGa alloy, and a MnGe alloy.

5. The magnetic film according to claim 1, wherein the ferromagnetic layer includes one selected from the group consisting of boron, carbon, and silver.

6. The magnetic film according to claim 1, further comprising:
an impurity absorption layer,
wherein the impurity absorption layer is stacked in a thickness direction of the ferromagnetic layer, and
wherein the impurity absorption layer includes one element selected from the group consisting of Mg, Ta, W, and Mo.

7. The magnetic film according to claim 6, further comprising:
a diffusion prevention layer,
wherein the diffusion prevention layer is stacked opposite to the impurity absorption layer when the ferromagnetic layer serves as a reference layer, and
wherein the diffusion prevention layer includes one element selected from the group consisting of Ta, Mo, W, Cr, and V.

8. The magnetic film according to claim 1, further comprising:
an underlying layer,
wherein the underlying layer is stacked in a thickness direction of the ferromagnetic layer, and
wherein the underlying layer is amorphous.

9. The magnetic film according to claim 1, further comprising:
an underlying layer, wherein the underlying layer is stacked in a thickness direction of the ferromagnetic layer, wherein the underlaying layer has a crystalline structure, and wherein lattice mismatch between a crystal lattice of an alignment surface of the underlying layer and a crystal lattice of a (111) surface of the ferromagnetic layer is equal to or greater than 5%.

10. A magnetoresistive effect element comprising:
the magnetic film according to claim 1;
a second magnetic film; and
a nonmagnetic film between the magnetic film and the second magnetic film.

11. The magnetoresistive effect element according to claim 10, further comprising:
a spin orbital torque wiring configured to have a function of generating a spin current by a spin Hall effect when a current flows,
wherein the spin orbital torque wiring is in contact with the magnetic film.

12. The magnetoresistive effect element according to claim 10, further comprising:
a spin orbital torque wiring configured to have a function of generating a spin current by a spin Hall effect when a current flows,
wherein the spin orbital torque wiring is in contact with the second magnetic film.

13. A method for manufacturing a magnetic film, the method comprising crystalizing an alloy for which a disorder structure and an order structure are able to be selected while applying a direct-current magnetic field in one direction under a temperature condition equal to or greater than a Curie temperature $T_{CD}$ of the disorder structure and equal to or less than a Curie temperature $T_{CO}$ of the order structure, and wherein a direction in which the direct-current magnetic field is applied is a thickness direction of a magnetic film to be stacked.

14. The method for manufacturing the magnetic film according to claim 13, wherein the crystallizing is performed after a film of the alloy is formed.

15. The method for manufacturing the magnetic film according to claim 13, wherein a direction in which the direct-current magnetic field is applied is an in-plane direction of a magnetic film to be stacked.

16. The method for manufacturing the magnetic film according to claim 13, wherein the direct-current magnetic field is equal to or less than 2 T.

17. The method for manufacturing the magnetic film according to claim 13, wherein, during an increase in temperature, the direct-current magnetic field is applied from a temperature equal to or less than the Curie temperature $T_{CD}$ of the disorder structure.

18. The method for manufacturing the magnetic film according to claim 13, wherein the temperature condition is equal to or greater than 350° C.

* * * * *